United States Patent [19]

Cook et al.

[11] 3,881,884

[45] May 6, 1975

[54] METHOD FOR THE FORMATION OF CORROSION RESISTANT ELECTRONIC INTERCONNECTIONS

[75] Inventors: Herbert Carl Cook, Georgia; Paul Alden Farrar, South Burlington; Robert Lee Hallen, Essex, all of Vt.

[73] Assignee: International Business Machines Corporation, Armonk, N.Y.

[22] Filed: Oct. 12, 1973

[21] Appl. No.: 406,125

[52] U.S. Cl. .................... 29/590; 29/591; 357/71; 357/68; 117/71 R; 117/212; 117/217; 117/218; 156/8; 156/18

[51] Int. Cl. .................... H01l 19/00

[58] Field of Search .................... 156/7, 8, 11, 17, 18; 117/212, 71 R, 217, 218; 29/590, 582, 578, 591; 357/68, 71

[56] References Cited

UNITED STATES PATENTS

| | | | |
|---|---|---|---|
| 2,724,663 | 11/1955 | Bond | 117/71 R |
| 3,458,925 | 8/1969 | Napier et al. | 29/580 |
| 3,677,843 | 7/1972 | Reiss | 156/17 |

*Primary Examiner*—Charles E. Van Horn
*Assistant Examiner*—Jerome W. Massie
*Attorney, Agent, or Firm*—Daniel E. Igo

[57] ABSTRACT

Disclosed is a method for the manufacture of composite thin films useful among other applications as electronic microcircuit interconnections, fuses, and contacts, terminal pads and voltage distribution ring metallurgy comprising in carrying out an integral circuit fabrication process the steps of first depositing a barrier layer of antidiffusion material, such as chromium, followed by superimposing thereon a film of highly conductive metals susceptible to corrosion and followed by the deposition of a highly corrosive resistant metal film. A subtractive etch pattern is formed in the composite metal film followed by heating the structure to an elevated temperature for a predetermined period of time so that the uppermost layer of the composite flows by diffusion over the edge section to protect the conductive metal film from corrosive effects.

10 Claims, 6 Drawing Figures

METHOD FOR THE FORMATION OF CORROSION RESISTANT ELECTRONIC INTERCONNECTIONS

BACKGROUND OF INVENTION

1. Field of Invention

This invention relates to a method for depositing thin electronic interconnecting electrical circuit films, and more particularly to interconnection of electrical circuitry and to the method of manufacture thereof.

A major problem in the manufacture of highly miniaturized electronic circuitry, also referred to as microminiaturized circuitry, has been the interconnection of the various elements or subcircuits comprising the circuits. Because of the extremely small size of the components and even smaller of the electrical leads used with such components, the use of conventional wiring techniques is so inefficient as to be completely impractical.

Many techniques for printing, etching, or depositing electrical interconnection are in general use. However, these techniques and devices made by their use suffer disadvantages. In general, such devices have been very costly and difficult to manufacture. Also the extremely small size required for use with microminiaturized circuits has generally not been obtained. It is highly desirable that interconnection thin films be stable, firmly adherent, and otherwise resistant to a variety of mechanical, chemical, thermal, and electrical stresses.

2. Description of the Prior Art

Heretofore electrical devices having pressure generated electrical contacts contained therein have encountered difficulties with nickel, gold, silver, antimony, lead foil electrical contacts, during power or duty cycling of the electrical devices embodying nickel, gold plated electrical contacts. The forward voltage drop of the device was abnormally increased and complete failure of the devices often occurred. Similarly, it has been the practice to make intermetallic bonds between gold and aluminum. Such intermetallic normally cause degradation of bonding strength as well as increasing the resistance of the OHMIC contact. It can eventually result in an open circuit due to the voids that form between the gold and aluminum interface. These formations are dependent upon pressure, temperature, and time of bonding operations. As the number of bonds required to complete the integrated circuit increase, the number and the size of the voids increase. Similarly, it is known to form printed circuit terminations in which connecting copper tubes are coated with a layer of a noble metal such as gold. The coating of gold is suitable for forming thermal compression bonds or welds with a copper base because the coating of gold is capable of plastic flow and diffusion which promotes thermal compression welding to form true metallurgical bonds. Likewise it is known to form printed circuits by a technique comprising an electrically conductive circuit portion consisting of a base metal of copper alloy with a first layer thereon of a noble metal selected from a group consisting of platinum, rhodium, palladium, and ruthenium and a layer of gold on the top of the first metal layer.

In the manufacture of thin film circuits, it is necessary to attach or solder wire leads or metallic ribbon and terminals to various sections of the circuit. One other contact termination or path that has been utilized, comprises successive layers of nickel-chromium alloy, copper and palladium. Copper by itself does not adhere strongly to silicon or certain other materials such as semiconductor materials used in the manufacture of thin film circuitry. Therefore, prior art teachings revealed a nickel-chromium alloy layer as a suitable material which will readily adhere to both the thin film circuit and the superimposed copper layer. Copper is used as a layer because of its good solderability as well as good electrical conductivity characteristics. These properties decrease the overall resistivity of the termination particularly at the junction with a solder. It is known to use an overlaying layer of palladium to protect the copper surface by preventing atmospheric or ambient oxidation of the copper conductor. Likewise it is known to use an intermediate precious metal layer between a copper printed circuit and a gold filled emergent plated thereon to provide a diffusion barrier between the copper base and the gold thereby providing better corrosion resistance.

It is highly desirable that thin films be stable, firmly adherent and otherwise resistant to a variety of mechanical, chemical, thermal and electrical stresses. For example, in some circuit construction schemes conductor lines of the multilayer structure are tinned and then transistor or other elements are soldered thereto. Frequently vacuum deposited chromium is used as a primer or underlayer for copper conductor lines for improving the adherence of the copper to the dielectric which is typically silicon dioxide, quartz or even an organic polymer. In the light of the thinness of the insulating or dielectric material, the high energy deposition e.g. sputtering, of chromium and other barrier layers thereon tends all the more to aggrevate the problem of insulation breakdown at cross overs. At the same time any processing improvement for reduction of cross over insulation failure must take into account the delicate nature of the structures involved and the requirement that the inter-adherence on the superimposed layers must not be diminished.

SUMMARY OF INVENTION

It is an object of this invention to provide a method of forming improved semiconductor interconnection metallurgy.

It is another object of this invention to provide semiconductor interconnection metallurgy having improved corrosion resistance.

It is still a further object of this invention to provide a method for the deposition or other formation of microelectronic circuit interconnection metallurgy in a manner compatible with prior and subsequent processing parameters.

The foregoing and other objects of this invention are more particularly described in connection with the drawings and the specific embodiments and are accomplished by providing a method of thin film formation upon dielectric, semiconductor, or other materials by first forming a base barrier layer which is followed by a transitory layer formation of the first primary barrier layer and a second conductive layer thereon which in turn is covered by a third corrosion resistant film and partially subtracting the composite to form the desired multi-layer conductive pattern and subjecting the etched composite to elevated temperature to cause surface diffusion and alloying to protect exposed areas of the conductive composite edges.

BRIEF DESCRIPTION OF THE PREFERRED EMBODIMENT

The use of many materials for interconnection metallurgy, fuses, terminal pads, and the like, in microminiature integrated circuits is limited in that the material will react with the environment in which it is to operate. This invention teaches a method for the use of chromium-copper-gold composite conductor by which surface diffusion and flow can be utilized to move material from the upper most layer of the metallurgy composite over the edges and into surface defects in a manner to prevent edge or other corrosion under operating conditions which in turn provides a metallized defect free passivation layer. Passivating layer materials most commonly used are quartz and organic polymeric materials which exhibit appropriate electrical passivating properties. Organic polymeric materials such as the polyimide compounds are in common usage.

The selection and use of contact conductive metallurgy in association with the passivating material is dependent upon the relationship between the modulus of elasticity and thermal expansion coefficients of the materials to be used. The proper selection of these materials with regard to their physical characteristics minimizes or avoids thermal stressing resulting from heat treatment and annealing during subsequent processing steps, as well as under ultimate operating conditions. Thermally induced stresses cause cracking and other defects in the materials which result in shorting or other electrical malfunctions which in turn makes the ultimate device inoperative or defective.

Figure 1:
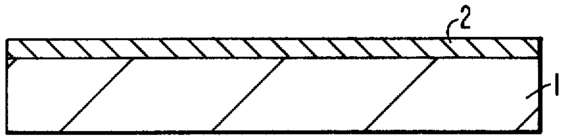
FIG. 1 is a cross-sectional view illustrating a substrate having the first metal layer of the composite thereon.

Referring to the drawings, FIG. 1 illustrates a substrate 1 of any desired passivating material, such as quartz, organic polyimide or any other materials, and having deposited thereon a first film of chromium 2. Film deposition is accomplished by any well known techniques such as evaporative deposition, chemical vapor deposition methods, sputtering, and the like. The first or primary film deposited acts as a diffusion barrier and adhesion promotor upon which subsequent conductive films are formed to make a composite structure.

In this specific example, a quartz substrate having previously formed device structures at lower levels and being from 10,000 to 50,000 Angstroms in thickness was subjected to a first chromium deposition by the known evaporative technique wherein a metal source is heated to evaporation conditions and the metal deposited in a controlled manner on the structure. If a multiplicity of devices are formed on a single substrate, the entire substrate can receive the first barrier layer simultaneously. A layer of chromium from 650 Angstroms to 750 Angstroms was deposited at the rate of approximately 4 Angstroms per second under an evaporative substrate temperature between 130°C and 165°C. The thickness of the film to be deposited is dependent upon the ultimate device structure and usage as well as the nature of the physical properties of the substrate and the relative coefficients of expansion values of the film metal and the substrate material. In this instance, a film of 700 Angstroms of chromium was deposited upon quartz.

Figure 2:
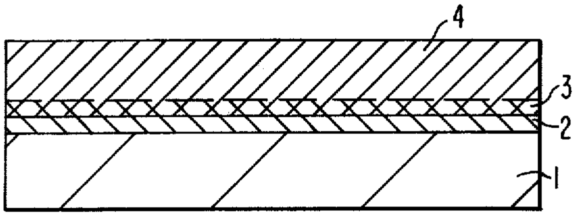
FIG. 2 is a similar cross-sectional view as FIG. 1 showing an intermediate transitional metal layer and the second metal layer of the composite deposition.

FIG. 2 illustrates the structure of FIG. 1 upon which an intermediate layer of chromium and copper 3 was deposited by continuing the evaporative deposition of chromium and adding thereto copper from a separate evaporation source so that a mixture or two phase structure of chromium and copper is deposited upon the first deposited chromium layer. Similarly the source of copper and chromium may be possibly accomplished from a single evaporative source of the desired transitory film mixture per se. This technique allows an integral transition between the two metals insuring adequate bonding. In this particular example, 500 Angstroms of chromium-copper was deposited at a rate of between 6 to 10 Angstroms per second at a temperature of 150°C in the preferred deposition range of 135°C to 160°C. Upon acquiring the proper thickness of chromium-copper, in this instance 500 Angstroms, the chromium source was terminated and the copper deposition continued at a rate of between 12 to 16 Angstroms per second to a copper layer thickness of 9,000 Angstroms illustrated at 4 in FIG. 2 whereupon the copper source is terminated and a gold deposition source activated to produce the upper most layer of gold as illustrated at 5 in FIG. 3.

Figure 3:
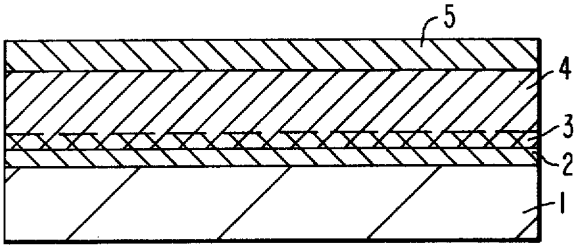
FIG. 3 is a similar cross-sectional view as FIG. 2 having the final metal layer of the composite deposited thereon.

Gold deposition was carried out at a rate of between 5 to 7 Angstroms per second at a deposition temperature of 150°C until a thickness of 1,400 Angstroms was acquired.

Where a chromium-copper-gold composite is sequentially or otherwise deposited upon a quartz passivation layer, the preferred structure comprises 650 to 750 Angstroms of first layer chromium, 450 to 550 Angstroms of transitory chromium-copper layer, 8,500 to 9,500 Angstroms of copper, and an uppermost layer of 1,250 to 1,550 Angstroms of gold producing a composite structure as illustrated in FIG. 3.

Figure 4:
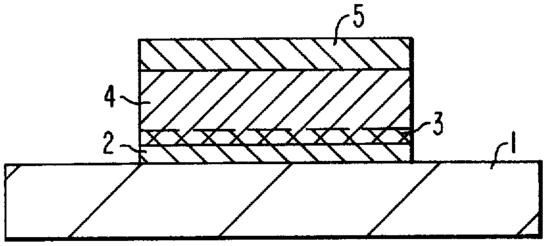
FIG. 4 is a similar cross-sectional view as FIG. 3 illustrating the subtractive etch of a portion of the composite shown in FIG. 3.

Utilizing well known standard photolithography techniques, the structure illustrated in FIG. 3 was appropriately masked and subtractively etched using an etchant process comprising a double bath of potassium iodide-iodine ($KI$-$I_2$) followed by $KMnO_4$ in caustic solution to form a structure as illustrated in FIG. 4 wherein the edges or sides of the composite layer previously formed are exposed as illustrated by the reference numerals 2, 3, 4 and 5 of FIG. 4.

Figure 6:
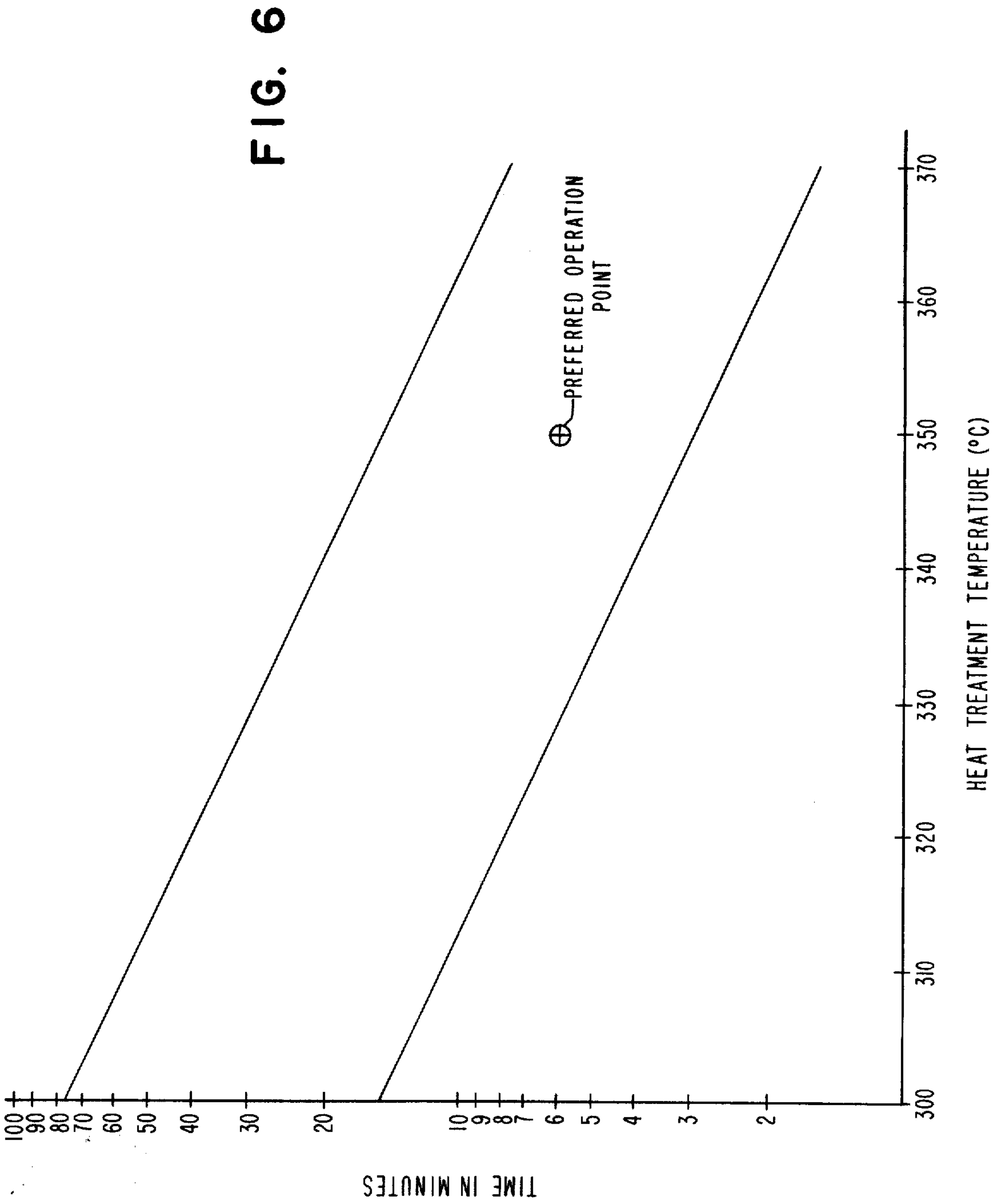
FIG. 6 is a plot of the heating or annealing step conditions showing time versus temperature.

The subtractively etched structure illustrated in FIG. 4 is subjected to heat treatment in an inert gas atmosphere such as nitrogen or argon or other desired atmosphere for example a hydrogen reducing ambient for a period of time and temperature illustrated in the plot of FIG. 6 and within the maximum and minimum limits therein delineated. Where a chromium-copper-gold composite is formed on a quartz substrate a preferred heat treatment or annealing temperature of 350°C and the corresponding time period is desirable while maintaining an atmosphere of hydrogen. It should be emphasized these heat treatment conditions are dependent upon substrate material, metallurgy composition, thickness and corresponding physical and chemical properties of the substances and that this specific embodiment is only illustrative of the invention. For example, when the substrate is a polyimide covered substrate, metal film disposition temperature is between 200°C and 250°C and metal film thicknesses may increase, e.g. first chromium layer to about 1,000 Angstroms and uppermost gold to 1,600 Angstroms.

Figure 5:
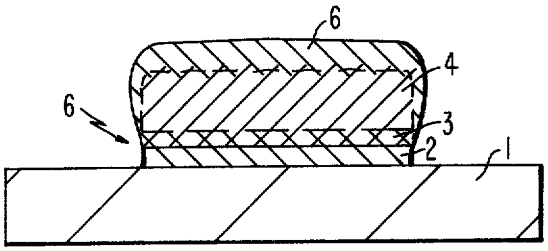
FIG. 5 is a similar cross-sectional view as FIG. 4 illustrating the final step in the process subsequent to the heating step.

Upon heat treatment as previously specified, copper is believed to diffuse into the gold so as to allow a gold-copper solution to diffuse or flow over the edges of the composite illustrated in FIG. 5 at reference numeral 6. This flow is a surface diffusion over the edges of the conductor reaching to the barrier layer of chromium in a manner to seal or cover the edge of the structure with a gold-copper solid solution.

It was found in this specific example using a quartz substrate that an upper layer contained approximately 30 percent copper which resulted from a heat treatment of 350°C for 4 minutes. The resultant preferred surface diffusion over the edge of the structure was achieved. Although a temperature of 345° to 350°C for a period of 4 to 10 minutes in a hydrogen atmosphere is desirable for use in heat treating chromium-copper-gold metallurgy on a quartz substrate, other appropriate heat treatment conditions will be necessary where, for example, a polyimide substrate is desired as a passivating substrate layer. Likewise, the thicknesses of the substrate layer and the various metal layers of the composite conductive materials may be varied in accordance with the physical and chemical properties of the substrate and the deposited metallurgy with particular reference to the modulus of elasticity and the coefficient of expansion of these materials.

It is known that the rates of surface diffusion can be $10^6$ or more times greater than the rate of bulk diffusion and it is with this known property of materials that temperature and time parameters are established to carry out the method of this invention.

The resulting structure of the specific example or embodiment herein described is illustrated in FIG. 5 which depicts a composite conductive layer. The top and side exposed surfaces covered with a noncorrosive metal or alloy suitable for use in miniaturized electronic integrated circuits, e.g. noble metals such as gold, platinum, palladium, iriduim, rhodium, ruthenium and osmium.

While the invention has been particularly shown and described with reference to the preferred embodiment thereof, it will be understood by those skilled in the art that various changes in form and details of the device and the method of making it may be made therein without departing from the spirit and scope of the invention.

What is claimed is:

1. In an integrated circuit fabrication process the steps of depositing on a partially fabricated integrated circuit substrate a composite conductive film structure by sequentially forming a first conductive film and superimposing thereon a second conductive film through a transistory layer made of material of both of said first and second films and forming thereon a third noble metal conductive metal film followed by subtractively etching a portion of said composite film to form a given pattern having exposed edges of said second film and heating the etched structure to an elevated temperature in a selected atmosphere to flow by surface diffusion a portion of said noble metal film over the exposed edges of said second film.

2. A method in accordance with claim 1 wherein said composite film is a sequential deposition of chromium, copper and gold.

3. A method in accordance with claim 1 wherein said composite film is formed on a quartz covered substrate.

4. A method in accordance with claim 1 wherein said composite film is formed on an organic polymeric covered substrate.

5. A method in accordance with claim 1 wherein said composite film is formed on a polyimide covered substrate.

6. A method in accordance with claim 1 wherein said heat treatment is carried out in a reducing atmosphere.

7. A method in accordance with claim 1 wherein said heat treatment is carried out in a hydrogen atmosphere.

8. A method in accordance with claim 1 wherein said heat treatment is carried out in an inert gas atmosphere.

9. A method in accordance with claim 1 wherein said noble metal film is gold.

10. A method in accordance with claim 1 wherein said substrate is quartz covered and the composite film is sequentially chromium-copper-gold heat treated in a hydrogen atmosphere to a temperature between 345°C and 355°C.

* * * * *